United States Patent
Zhang et al.

(10) Patent No.: US 9,230,577 B2
(45) Date of Patent: Jan. 5, 2016

(54) THIN SEEDED ANTIFERROMAGNETIC COUPLED SIDE SHIELD FOR SENSOR BIASING APPLICATIONS

(71) Applicant: Headway Technologies, Inc., Milpitas, CA (US)

(72) Inventors: Kunliang Zhang, Fremont, CA (US); Yewhee Chye, Hayward, CA (US); Min Li, Fremont, CA (US); Glen Garfunkel, San Jose, CA (US)

(73) Assignee: Headway Technologies, Inc., Milpitas, CA (US)

(*) Notice: Subject to any disclaimer, the term of this patent is extended or adjusted under 35 U.S.C. 154(b) by 0 days.

(21) Appl. No.: 13/785,227

(22) Filed: Mar. 5, 2013

(65) Prior Publication Data
US 2014/0252517 A1   Sep. 11, 2014

(51) Int. Cl.
*H01L 29/82* (2006.01)
*G11B 5/39* (2006.01)
*G01R 33/09* (2006.01)

(52) U.S. Cl.
CPC ............ *G11B 5/3932* (2013.01); *G01R 33/093* (2013.01); *G01R 33/098* (2013.01); *G11B 5/398* (2013.01); *G11B 5/3912* (2013.01)

(58) Field of Classification Search
CPC ...... B82Y 25/00; B82Y 10/00; G11B 5/3932; G11B 2005/3996; G01R 33/093
USPC .............. 360/324.12; 365/158; 257/E29.323, 257/421–424, 427; 438/3; 13/324.12; 525/324.12
See application file for complete search history.

(56) References Cited

U.S. PATENT DOCUMENTS

| | | | |
|---|---|---|---|
| 6,266,218 B1* | 7/2001 | Carey et al. | 360/324.12 |
| 8,179,642 B2 | 5/2012 | Kawamori et al. | |
| 2002/0064002 A1* | 5/2002 | Gill | 360/319 |
| 2005/0213264 A1* | 9/2005 | Gill | 360/324.12 |
| 2006/0114622 A1* | 6/2006 | Gill | 360/324.12 |
| 2006/0198059 A1* | 9/2006 | Sakai et al. | 360/324.12 |
| 2007/0081277 A1 | 4/2007 | Folks et al. | |
| 2009/0279213 A1 | 11/2009 | Wu et al. | |
| 2010/0330395 A1* | 12/2010 | Zhang et al. | 428/813 |

(Continued)

OTHER PUBLICATIONS

"An Areal-Density Capability Study of SMR by using improved Write and Read Heads," by T. Kagami et al., Intermag 2011, IEICE Technical.

(Continued)

*Primary Examiner* — David Vu
*Assistant Examiner* — Jonathan Han
(74) *Attorney, Agent, or Firm* — Saile Ackerman LLC; Stephen B. Ackerman

(57) ABSTRACT

A composite side shield structure is disclosed for providing biasing to a free layer in a sensor structure. The sensor is formed between a bottom shield and top shield each having a magnetization in a first direction that is parallel to an ABS. The side shield is stabilized by an antiferromagnetic (AFM) coupling scheme wherein a bottom (first) magnetic layer is AFM coupled to a second magnetic layer which in turn is AFM coupled to an uppermost (third) magnetic layer. First and third magnetic layers each have a magnetization aligned in the first direction and are coupled to bottom and top shields, respectively, for additional stabilization. The top shield may be modified to include an AFM scheme for providing additional stabilization and guidance to magnetic moments within AFM coupled magnetic layers in the top shield, and to the third magnetic layer in the side shield.

18 Claims, 4 Drawing Sheets

(56) References Cited

U.S. PATENT DOCUMENTS

| | | |
|---|---|---|
| 2011/0051291 A1 | 3/2011 | Miyauchi et al. |
| 2011/0069417 A1 | 3/2011 | Kawamori et al. |
| 2011/0090595 A1 | 4/2011 | Hirata et al. |
| 2012/0161263 A1* | 6/2012 | Maat et al. .................... 257/422 |

OTHER PUBLICATIONS

Committee Submission System, Conference Paper's Information, 3 pgs., Nov. 18, 2011.

* cited by examiner

THIN SEEDED ANTIFERROMAGNETIC COUPLED SIDE SHIELD FOR SENSOR BIASING APPLICATIONS

TECHNICAL FIELD

The present disclosure relates to a stabilization scheme for a sensor element in a read head, and in particular to a bias structure for thin film magneto-resistive (MR) sensors that is based on antiferromagnetically coupled side shields to enable a more stable magnetization in the primary biasing layer.

BACKGROUND

In a magnetic recording device in which a read head is based on a spin valve magnetoresistance (SVMR) or a giant magnetoresistance (GMR) effect, there is a constant drive to increase recording density. One method of accomplishing this objective is to decrease the size of the sensor element in the read head. The sensor is a critical component in which different magnetic states are detected by passing a sense current through the sensor and monitoring a resistance change. A GMR configuration includes two ferromagnetic layers which are separated by a non-magnetic conductive layer in the sensor stack. One of the ferromagnetic layers is a pinned layer wherein the magnetization direction is fixed by exchange coupling with an adjacent antiferromagnetic (AFM) pinning layer. The second ferromagnetic layer is a free layer wherein the magnetization vector can rotate in response to external magnetic fields, and is aligned either parallel or anti-parallel to the magnetic moment in the pinned layer to establish a "0" or "1" memory state. When an external magnetic field is applied by passing the sensor over a recording medium at an air bearing surface (ABS), the free layer magnetic moment may rotate to an opposite direction. Alternatively, in a tunneling magnetoresistive (TMR) sensor, the two ferromagnetic layers are separated by a thin non-magnetic dielectric layer. A sense current is used to detect a resistance value which is lower in a "0" memory state than in a "1" memory state. In a CPP configuration, a sense current is passed through the sensor in a direction perpendicular to the layers in the sensor stack.

Ultra-high density (over 100 Gb/in$^2$) recording requires a highly sensitive read head in which the cross-sectional area of the sensor is typically smaller than 0.1×0.1 microns at the ABS. Current recording head applications are typically based on an abutting junction configuration in which a hard bias layer is formed adjacent to each side of a free layer in a GMR spin valve structure. As the recording density further increases and track width decreases, the junction edge stability becomes more important so that edge demagnification in the free layer needs to be reduced. In other words, horizontal (longitudinal) biasing is necessary so that a single domain magnetization state in the free layer will be stable against all reasonable perturbations while the sensor maintains relatively high signal sensitivity.

In longitudinal biasing read head design, hard bias films of high coercivity are abutted against the edges of the sensor and particularly against the sides of the free layer. In other designs, there is a thin seed layer between the hard bias layer and free layer. By arranging for the flux flow in the free layer to be equal to the flux flow in the adjoining hard bias layer, the demagnetizing field at the junction edges of the aforementioned layers vanishes because of the absence of magnetic poles at the junction. As the critical dimensions for sensor elements become smaller with higher recording density requirements, the free layer becomes more volatile and more difficult to bias. Traditional biasing schemes using a hard magnet bias have become problematic due to randomly distributed hard magnetic grains within the hard bias layer. Since current technology is unable to provide an improved biasing structure that is capable of stabilizing a sensor in an ultra-high density recording device with high reliability, a new concept for effective biasing is needed.

SUMMARY

One objective of the present disclosure is to provide a biasing scheme for a free layer in a sensor structure that does not rely on a hard bias layer with high coercivity.

A second objective of the present disclosure is to provide a biasing scheme according to the first objective and with flexibility to enable a top shield to participate in the overall stabilization of the free layer by providing guidance for the biasing direction.

According to one embodiment of the present disclosure, these objectives are realized with an antiferromagnetically coupled side shield structure formed on opposite sides of a sensor along an ABS. The magnetic sensor includes a free layer formed in a plane that is orthogonal to the ABS and with a magnetic moment in a direction parallel to the ABS. The magnetic sensor has a bottom surface formed on a bottom shield, a top surface that adjoins a top shield, and sidewalls connecting the top and bottom surfaces. There is a non-magnetic insulation layer adjoining the sides of the sensor and a second section thereof that extends along a top surface of the bottom shield. The second section of insulation layer is formed in a plane that is parallel to the planes of the sensor layers and serves as a substrate for the sides shields comprised of antiferromagnetically coupled layers. A key feature of the side shields is a composite biasing structure that includes a lower seed layer which contacts a top surface of the insulation layer. Above the seed layer is sequentially formed a first magnetic layer, a first antiferromagnetic (AFM) coupling layer, a second magnetic layer, a second AFM coupling layer, and a third magnetic layer as the uppermost layer in the side shield stack. Each of the magnetic layers is comprised of one or more layers such as NiFe/CoFe for the first magnetic layer, CoFe for the second magnetic layer, and CoFe/NiFe for the third magnetic layer. Preferably, the lower NiFe layer in the first magnetic layer is Ni rich (70-90 atomic % Ni) and has a greater thickness than the other magnetic layers in the side shield stack. Each of the AFM coupling layers may be made of Ru, for example.

The magnetization in both of the bottom shield and top shield is aligned in a first cross-track direction that is parallel or anti-parallel to the magnetic moment in the free layer. Furthermore, the third magnetic layer in each side shield is ferromagnetically coupled to the top shield and thus has a magnetization aligned in the same direction as that in the top shield. As a result of the AFM coupling configuration, the second magnetic layer in the side shield has a magnetization opposite to the magnetization in the first and third magnetic layers. In effect, the lower NiFe layer in the first magnetic layer provides the majority of the longitudinal bias to the free layer. Through ferromagnetic coupling with the top shield and AFM coupling within the side shield stack, the biasing structure including the first magnetic layer is stabilized to a greater extent than realized with prior art stabilization schemes.

According to a second embodiment, the AFM configuration in the side shields is retained from the first embodiment. However, the top shield is modified to include an AFM configuration of layers. In particular, a first top shield magnetic layer contacts a top surface of the sensor and is aligned in the same direction as the magnetization in the bottom shield and in the first and third magnetic layers of the side shields. Above the first magnetic layer in the top shield is consecutively formed an AFM coupling layer, a second top shield magnetic layer, and an uppermost antiferromagnetic (AFM) layer such as IrMn that serves as a pinning layer for the underlying second top shield magnetic layer and thereby provides guidance to the top shield layer magnetization direction for proper biasing direction to the sensor and side shield structures. Therefore, the magnetic layer in the top shield has enhanced stabilization and in turn provides improved control of the magnetization directions in the underlying side shields.

The present disclosure also includes a method of forming a sensor that is stabilized with side shields having an AFM coupling configuration. Once a sensor stack of layers is formed on a bottom shield, a conventional photoresist patterning and etching sequence is employed to define the sensor shape and sidewalls along the ABS. Then an insulation layer and side shield layers are sequentially formed such that the uppermost layer in the side shields is essentially coplanar with a top surface of the sensor. After the photoresist layer is removed, the top shield is deposited and contacts the sensor and the side shields.

DETAILED DESCRIPTION

The present disclosure is a side shield design, and a method for making the same, for biasing an adjacent sensor element wherein AFM coupling in the side shield structure is employed to stabilize the magnetic layer providing the bulk of longitudinal biasing to the free layer in the sensor element. The side shield biasing scheme is effective with sensors based on a GMR or TMR configuration and may be used with sensor structures having a top spin valve, bottom spin valve, or dual spin valve configuration. The drawings are provided by way of example and are not necessarily drawn to scale.

Figure 1:
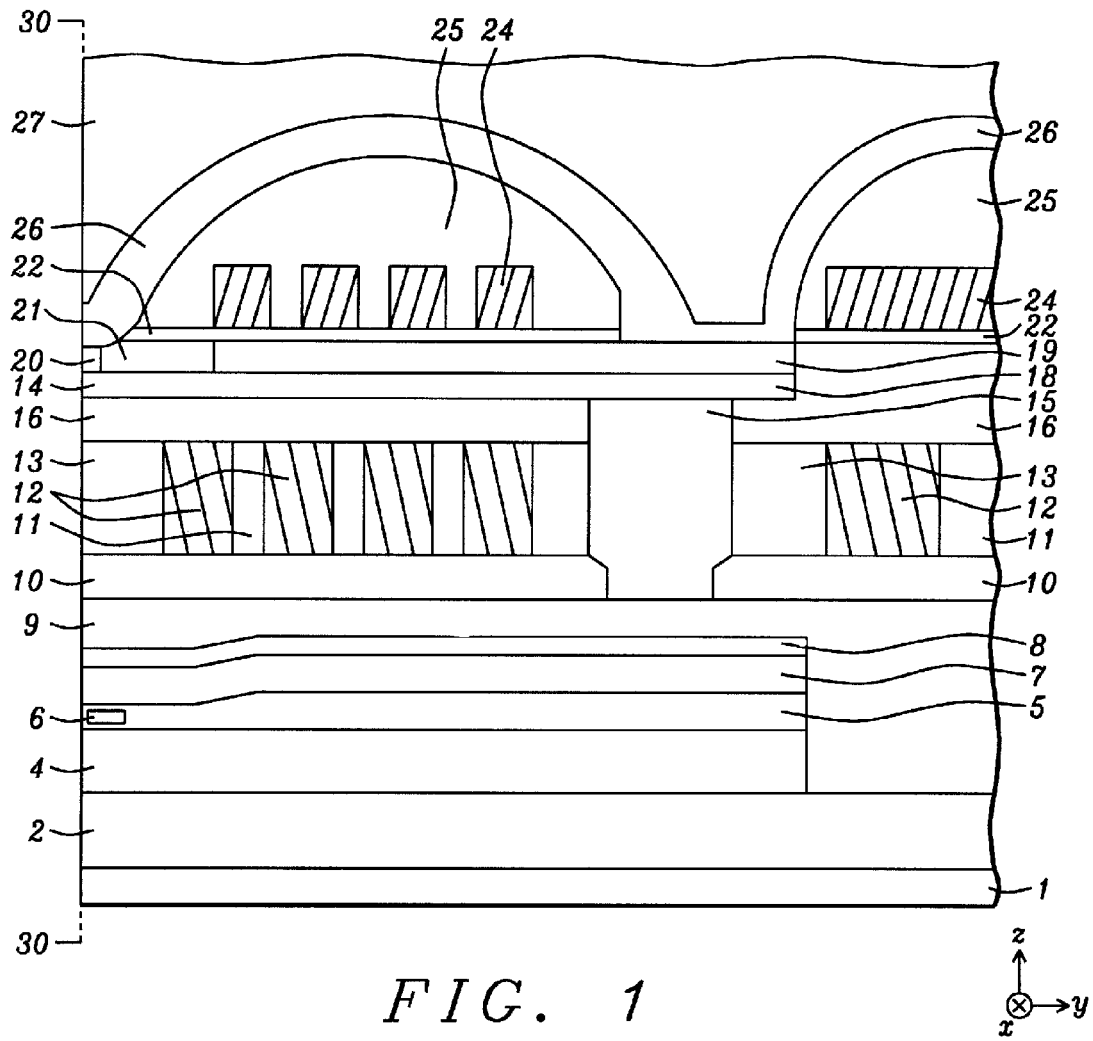
FIG. 1 is a cross-sectional view showing a merged read/write head with a sensor element formed along an ABS and between two top and bottom shields in the read head portion.

Referring to FIG. 1, one embodiment of a recording head of the present disclosure is depicted in a cross-sectional view from a plane orthogonal to an air bearing surface (ABS) 30-30. The z-axis indicates a down-track direction, the y-axis is perpendicular to the ABS and extends towards a back end of the device, and the x-axis is the cross-track direction. The read/write head is formed on a substrate 1 that may be comprised of AlTiC (alumina+TiC). The substrate 1 is typically part of a slider (not shown) formed in an array of sliders on a wafer. After the read/write head is fabricated, the wafer is sliced to form rows of sliders. Each row is typically lapped to afford an ABS before dicing to fabricate individual sliders that are used in a magnetic recording device. An insulation layer 2 is disposed on the AlTiC substrate 1 and may be made of a dielectric material such as alumina.

A bottom shield 4 also referred to as the S1 shield is formed on insulation layer 2 and may be comprised of NiFe, for example. There is a read gap 5 that is an insulation layer such as AlOx, MgOx, or SiOx between the S1 shield and a top (S2A) shield 7. A magneto-resistive element or sensor 6 is formed in the read gap 5 along the ABS 30-30 and typically includes a plurality of layers (not shown) in which two ferromagnetic layers are separated by a non-magnetic layer. The magnetic moment direction in one of the ferromagnetic layers is fixed and provides a reference direction, and the moment direction in the other ferromagnetic layer may be rotated by the magnetic field from the media. Resistance across the read gap changes as the moment in the second ferromagnetic layer rotates. A "0" or "1" magnetic state can be defined depending on whether the two ferromagnetic layers are magnetically aligned in the same direction or in an anti-parallel fashion. The non-magnetic layer in the sensor 6 may be Cu in a giant magnetoresistive (GMR) sensor or may be comprised of an insulator such as alumina or MgOx in a tunneling magnetoresistive (TMR) sensor.

Above the top shield 7, an insulation layer 8 and a top shield (S2B) layer 9 are sequentially formed. Top shield layers 7, 9 may be made of the same magnetic material as in the S1 shield 4, and insulation layer 8 may be the same dielectric material as in insulation layer 2. Those skilled in the art will recognize that layers 2-9 represent the read head portion of the read/write head and layers 9-27 represent the write head portion. Note that the S2B layer 9 may serve as a flux return pole in the write head portion of the read/write head.

The present disclosure anticipates that various configurations of a write head may be employed with the read head portion. In the exemplary embodiment, there is a first section of an insulation layer 10 formed on the S2B shield layer 9 and between the ABS 30-30 and a back gap connection 15. Note that the insulation layer 10 has a second section that adjoins the back gap connection along a side opposite the first section. A heater (not shown) may be included in one of the aforementioned insulation layers to induce thermal expansion of the sensor and write head toward a magnetic medium along the ABS during a recording process. A bucking coil layer 12 is disposed on insulation layer 10 and is shown with four turns between the back gap connection 15 and ABS 30-30 that are separated from each other by an insulation layer 11 comprised of a photoresist material. The portion of bucking coil layer 12 closest to the ABS 30-30 is coplanar with an insulation layer 13 that is formed along the ABS. Insulation layers 10, 11, 13 are comprised of a dielectric layer and bucking coil layer is typically a conductive material such as Cu. The back gap connection 15 may be made of CoFeNi or the like and magnetically couples main pole layer 18 to S2B shield layer 9 that serves as a flux return pole.

An insulation layer 16 is formed on insulation layers 11, 13 and on bucking coil layer 12 and a first section extends from the ABS 30-30 to the back gap connection 15. Both of the insulation layers 11, 16 have a second section on the opposite side of the back gap connection 15 with respect to the ABS. Above the insulation layer 16 is a main pole layer 18 that may be comprised of CoFeNi or another magnetic material. Main pole layer 18 has a pole tip 14 at the ABS 30-30 and extends toward the back end of the device with a sufficient length to connect with back gap connection 15. A first write shield layer 20 indisposed on the main pole layer 18 at the ABS and extends a throat height distance (not shown) away from the ABS 30-30 to connect with a non-magnetic layer 21. The first write shield layer 20 may be made of CoFeN, CoFeNi, NiFe, or CoFe, for example, and is coplanar with the non-magnetic layer 21 and a yoke 19 which is formed on the main pole layer 18 and serves to concentrate magnetic flux at the write pole tip 14. There is an insulation layer 22 formed on a portion of the non-magnetic layer 21 and yoke 19. Magnetic flux in the yoke 19 is generated by passing a current through the main coil layer 24 that is disposed on the insulation layer 22.

There is a second shield layer 26 formed on the first shield layer 20 along the ABS and which arches over the main coil layer 24 and connects with the top surface of the yoke 19 in a region overlying the back gap connection 15. An insulation layer 25 is formed on the insulation layer 22 and fills the openings between the turns of the main coil layer 24 and the space between the main coil layer and the arched second shield layer 26. A protection layer 27 covers the second shield layer 26 and is made of an insulating material such as alumina.

Figure 2:
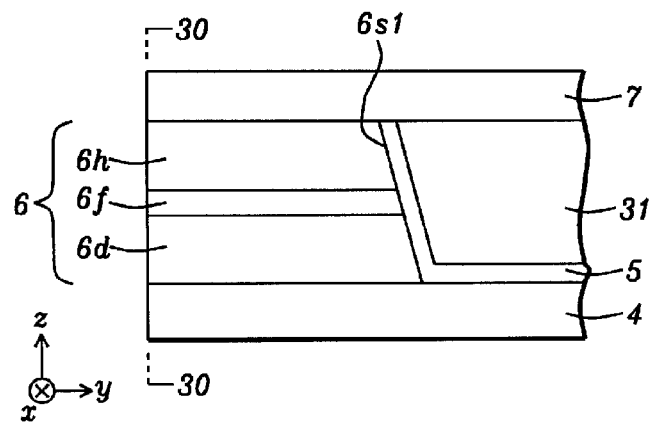
FIG. 2 is a cross-sectional view of a sensor formed between two shield layers wherein an insulation layer is formed along a back side of the sensor and opposite the ABS according to an embodiment of the present disclosure.

Referring to FIG. 2, an enlarged section of the read head in FIG. 1 is depicted and includes the sensor 6 along the ABS 30-30 as well as bottom shield 4 and top shield 7. According to one embodiment, an insulation layer 31 made of alumina, MgOx, or SiOx, for example, is formed on read gap layer 5 along the sensor back side 6s1 and on a portion of the top surface of bottom shield 4. In other words, no biasing is required along a back side of the sensor. In an alternative embodiment, insulation layer 31 may be combined with read gap layer 5 to form a single insulation layer made of AlOx, MgOx, or SiOx. Note that other layers 6d, 6h within the sensor are formed below and above the free layer 6f, respectively, and may each contain one or more layers. It should be understood that the biasing scheme described herein relates to various types of magnetoresistive structures including GMR and TMR, and applies to top spin valve, bottom spin valve, or dual spin valve sensors as appreciated by those skilled in the art. In a bottom spin valve configuration, layer 6h comprises at least a capping layer (not shown), and layer 6d includes a reference layer with a fixed magnetization direction, and a non-magnetic spacer (not shown) between the reference layer and free layer 6f. In a top spin valve configuration, layer 6d typically includes at least a seed layer while layer 6h comprises a reference layer, and a non-magnetic spacer between the reference layer and free layer 6f. In addition, an antiferromagnetic (AFM) layer such as IrMn may be formed on a side of the reference layer that faces away from the free layer to pin the magnetization direction in the reference layer.

Figure 3:
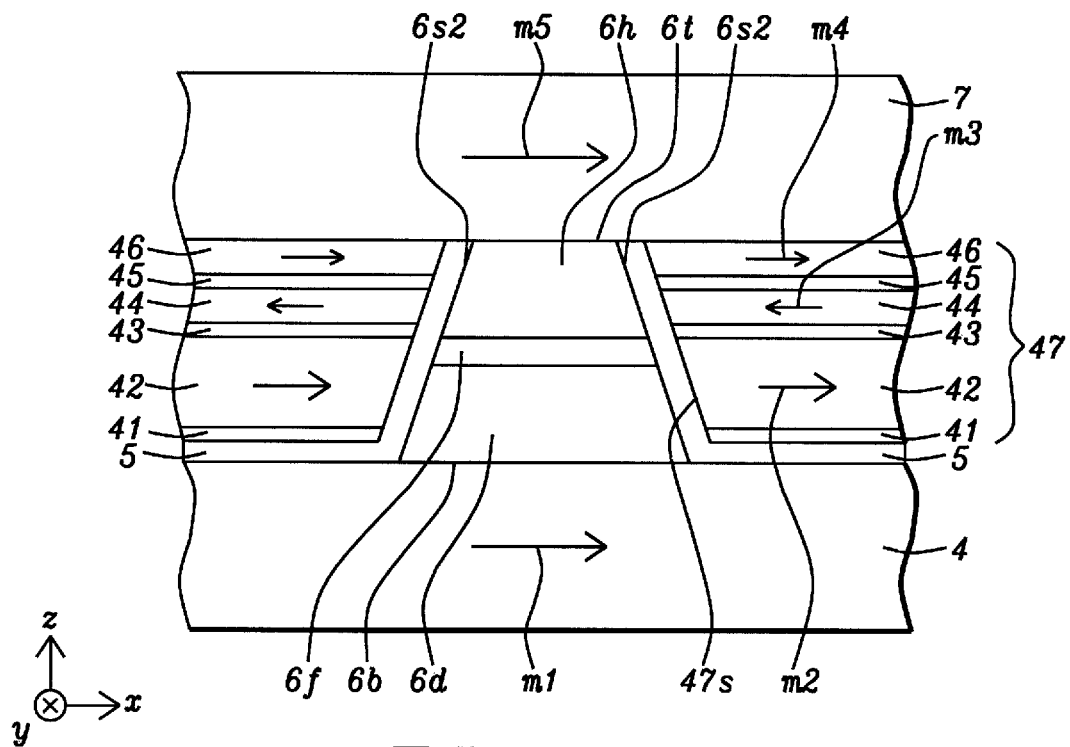
FIG. 3 is a cross-sectional view along the ABS of a sensor that is stabilized by side shields comprised of antiferromagnetic (AFM) coupled layers according to a first embodiment of the present disclosure.

Referring to FIG. 3, a cross-sectional view from an ABS is shown of a side shield structure formed between top and bottom shields wherein the side shields 47 provide biasing to the free layer 6f in adjacent sensor according to a first embodiment of the present disclosure. The bottom shield 4 has a magnetization m1 aligned in a cross-track (x-axis) direction, and top shield 7 has a magnetization m5 aligned in the same direction as m1. In the exemplary embodiment, free layer 6f has a magnetization (not shown) either parallel or anti-parallel to m1 depending on the magnetic state ("0" or "1") of the sensor. The m1 direction is typically set by a first anneal step that is performed before the layers in the sensor are deposited.

A key feature of the present disclosure is the side shield structure 47 with sidewalls 47s formed adjacent to sensor sides 6s2 and free layer 6f at the ABS and extending a distance of 30 nm to 2 microns from the ABS toward a back end of the read head. Sensor sides 6s2 connect with sensor side 6s1 (FIG. 2) at a certain distance from the ABS and thereby form a continuous sidewall around sensor 6. According to one embodiment, read gap layer 5 with a thickness from 10 to 100 Angstroms is formed on a top surface of bottom shield 4 except over portions that contact a sensor bottom surface 6b, and also extends along sidewalls 6s2 to separate the sensor from the side shields 47. The lower layer in the side shield structure is a seed layer 41 that contacts read gap layer 5 in a region above the bottom shield 4. The seed layer may be comprised of one or both of Ru and Ta and has a thickness from 5 to 50 Angstroms, and preferably 5 to 20 Angstroms. Optionally, other face centered cubic (fcc) materials known in the art may be employed as the seed layer to promote a smooth and uniform growth of overlying layers in the side shield structure. Accordingly, the seed layer may be selected from NiCr, NiFeCr, NiFe, Cu, or Ni, or composites such as Ta/NiCr, Ta/NiFeCr, Ta/NiFe, Ta/Cu, Ta/Ni, or composites wherein Ta in the aforementioned compositions is replaced by Hf, Ti, Zr, Nb, Mo, or the like.

Above the seed layer 41 is sequentially formed a first magnetic layer 42, a first antiferromagnetic (AFM) coupling layer 43, a second magnetic layer 44, a second AFM coupling layer 45, and a third magnetic layer 46. As a result, the magnetization m2 of first magnetic layer is aligned anti-parallel to magnetization m3 of the second magnetic layer while magnetization m4 of the third magnetic layer is also aligned anti-parallel to m3. Because of the close proximity of the first magnetic layer 42 to the bottom shield, m2 is aligned parallel to m1 by ferromagnetic coupling. Furthermore, the first magnetic layer preferably has a greater thickness than the second and third magnetic layers and thereby provides a majority of the longitudinal biasing to free layer 6f. Third magnetic layer 46 contacts a bottom surface of top shield 7 thereby inducing m4 to be aligned in the same direction as m5, the magnetization direction in the top shield. Consequently, the bottom shield and top shield play a key role in stabilizing the magnetizations m2, and m4, respectively. AFM coupling between magnetic layers 42 and 44, and between magnetic layers 44 and 46 also contributes to overall stabilization within the side shields 47. Enhanced stabilization of the side shields leads to high output sharpness and improved magnetic read width. Moreover, side shields 47 prevent stray magnetic fields produced by a magnetic medium from inadvertently switching the magnetization direction of the free layer.

Preferably, the first, second, and third magnetic layers are comprised of one or more of CoFe and NiFe wherein the Ni content is between 70 and 90 atomic % to yield a soft magnetic layer with a Bs from about 0.5 Tesla to 2.0 Tesla. However, other magnetic materials such as CoFeNi or CoFeM where M is an element such as V, Mo, Mg, Zr, Hf, Ta, or Nb may also be suitable for one or more of magnetic layers 42, 44, 46. As an example, first magnetic layer 42 may be a NiFe/CoFe composite wherein the lower NiFe layer has a thickness from 50 to 300 Angstroms, and preferably 50 to 200 Angstroms, while the CoFe layer preferably has a thickness between 5 and 20 Angstroms. Preferably, the second magnetic layer 44 is made of CoFe and has a thickness from 5 to 50 Angstroms. Third magnetic layer 46 may have a CoFe/NiFe configuration wherein the lower CoFe layer contacts the second AFM coupling layer 45 and has a thickness between 5 and 20 Angstroms, and the upper NiFe layer preferably has a thickness from 50 to 200 Angstroms. According to a preferred embodiment, the NiFe layer in first magnetic layer 42 has a greater thickness than the NiFe layer in the third magnetic layer 46 and provides a majority of the biasing to the adjacent free layer 6f.

In one aspect, the AFM coupling layers 43, 45 are made of Ru and have a thickness of 7 to 9 Angstroms to promote maximum AFM coupling between adjacent magnetic layers in the side shields. Alternatively, the AFM coupling layers may have a thickness of about 4 Angstroms or 14 Angstroms and induce AFM coupling between adjacent magnetic layers. In another embodiment, one or both of the AFM coupling layers are made of Rh, RhRu, Re, Ir, Mo, or other metals or alloys that promote antiferromagnetic coupling between first magnetic layer 42 and second magnetic layer 44, and between the second magnetic layer and third magnetic layer 46, respectively.

Figure 4:
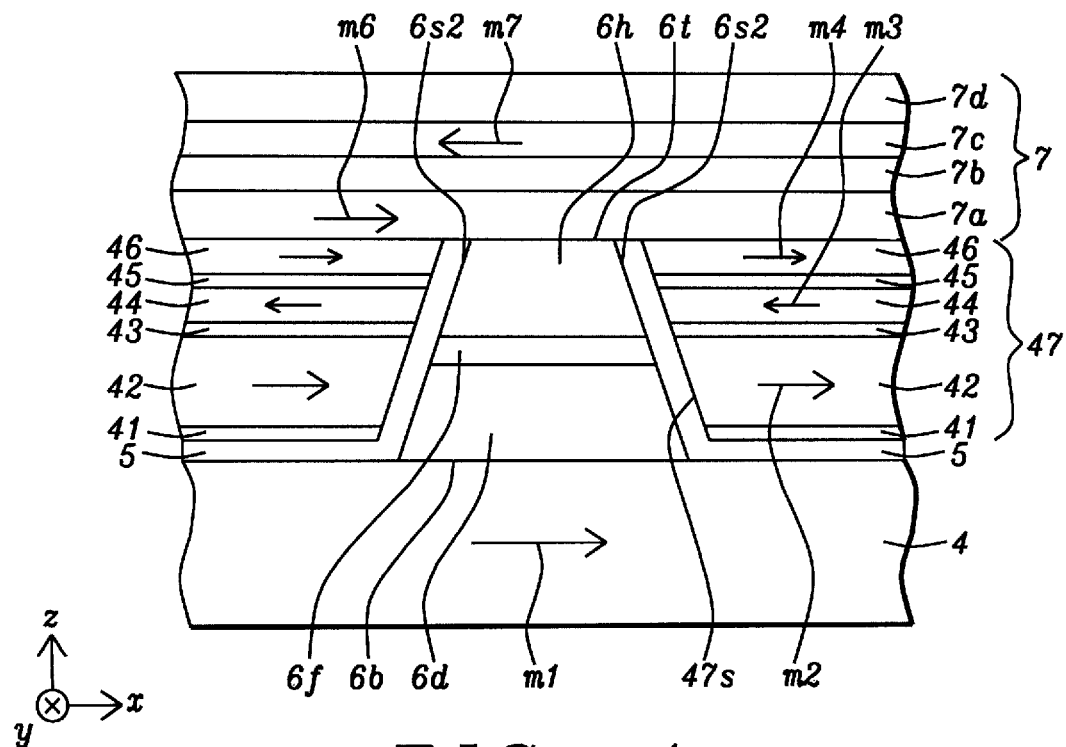
FIG. 4 is a cross-sectional view along the ABS of a sensor that is stabilized by side shields comprised of AFM coupled layers and by a top shield comprised of AFM coupled layers according to a second embodiment of the present disclosure.

Referring to FIG. 4, a second embodiment of the present disclosure is illustrated and retains all of the features of the first embodiment except the top shield structure 7 is modified to comprise antiferromagnetic coupling between magnetic layers 7a, 7c by inserting an AFM coupling layer 7b. The top shield also features an uppermost AFM layer 7d to pin the magnetic moment in the underlying magnetic layer 7c. As a result of the AFM coupling scheme, the uppermost AFM layer 7d preferably pins magnetic layer 7c in a magnetization direction m7 that is anti-parallel to m1. Because of the AFM coupling layer 7b, the magnetic moment m6 in the bottom magnetic layer 7a is aligned parallel to m1. Thus, the composite top shield structure in the second embodiment is advantageously used to provide guidance for magnetization direction in layers 7a, 7c and thereby enable further stabilization to the overall biasing scheme since third magnetic layer 46 in the side shields 47 is directly influenced by the adjoining layer 7a in the top shield. As indicated previously, bottom shield 4 influences the direction of m2 in first magnetic layer 42, top shield 7 influences the direction of m4 in third magnetic layer 46 while AFM coupling through layers 43, 45 involves second magnetic layer 44 and further reinforces the magnetization directions within the side shield layers. Therefore, AFM coupling in the top shield as shown in FIG. 4 is believed to provide additional stabilization to the side shield scheme introduced in the first embodiment.

Figure 5:
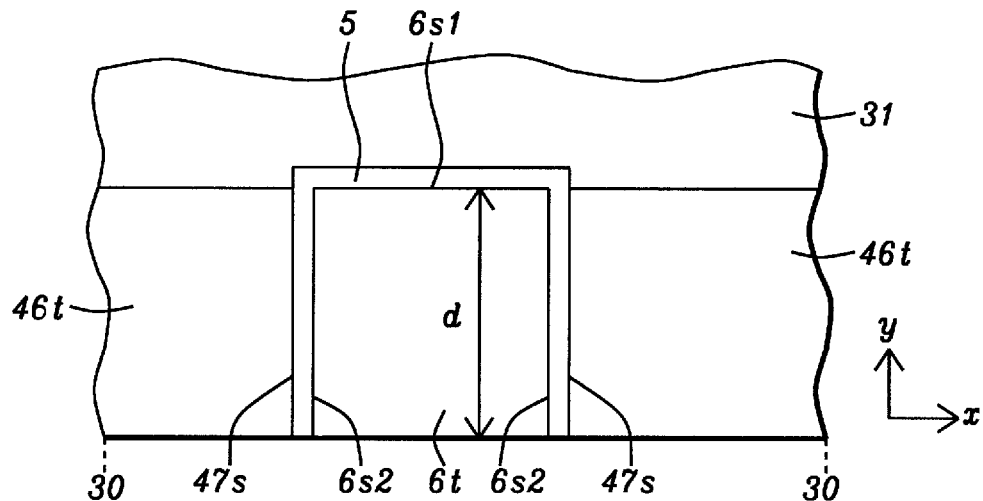
FIG. 5 is a top-down view of the embodiment in FIG. 3 where the top shield is removed to illustrate the side shields and top surface of the sensor.

According to one embodiment illustrated in a top-down view in FIG. 5 where top shield 7 has been removed to show a top surface 46t of the third magnetic layer in the side shields and a top surface 6t of the sensor. Side shield sidewalls 47s extend parallel to sides 6s2 towards a back side 6s1 of the sensor wherein the sensor back side is located a distance d of 30 nm to 2 microns in a y-axis direction from the ABS. Alternatively, the present disclosure anticipates an embodiment wherein side shields extend greater than distance d from the ABS. Preferably, the sidewalls 47s extend at least a distance d from the ABS to provide a maximum biasing effect to the free layer in the sensor.

Figure 6:
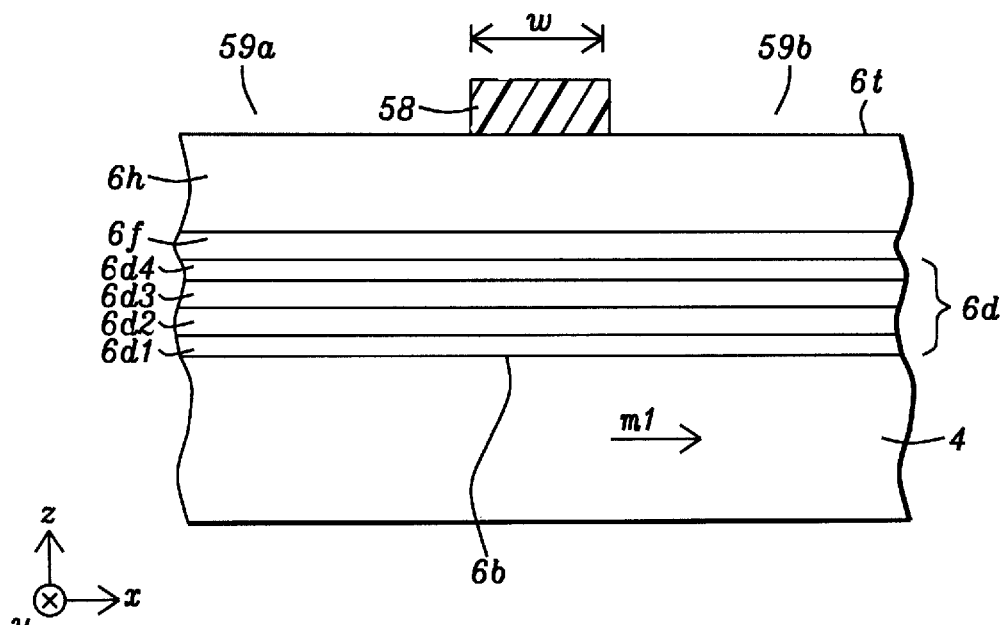
FIGS. 6-8 are cross-sectional views depicting a sequence of steps that are used to fabricate a sensor structure with side shields as depicted in the first embodiment.

The present disclosure also encompasses a method of forming a sensor with adjacent side shield structures that are stabilized by antiferromagnetic coupling between magnetic layers. In FIG. 6, a first step in a fabrication process is depicted wherein a bottom shield 4 is formed on a substrate (not shown) by a plating method, for example. The bottom shield is annealed by a conventional process to set the magnetization m1 in an x-axis direction. Thereafter, layers 6d, 6f, 6h in the sensor stack are sequentially formed on a top surface of the bottom shield by a sputter deposition process. According to one embodiment that represents a bottom spin valve configuration, layer 6d is comprised of a lower seed layer 6d1, a middle antiferromagnetic (AFM) layer 6d2, a reference layer 6d3 on the AFM layer and an upper non-magnetic spacer 6d4 on a top surface of the reference layer, and layer 6h is a capping layer. The non-magnetic spacer may be Cu in a GMR sensor or a tunnel barrier layer in a TMR sensor. In a TMR sensor embodiment, the upper non-magnetic spacer 6d4 is typically oxidized to form a tunnel barrier layer prior to depositing free layer 6f. However, the present disclosure also encompasses other sensor designs that include at least a reference layer, free layer, and non-magnetic spacer between the reference layer and free layer 6f wherein the reference layer may be part of either layer 6d or layer 6h.

During the following step in the fabrication sequence, a photoresist layer is spin coated and patterned on the sensor top surface 6t by a photolithography process to generate a pattern including a photoresist island 58 having a width w in the cross-track direction. The photoresist pattern typically includes a plurality of islands arranged in rows and columns from a top-down view that is not shown in order to focus on the key features in the drawing. In one aspect, the island may have a rectangular shape from a top-down view similar to the sensor top surface 6t shown in FIG. 5. There are openings 59a, 59b on either side of the photoresist island that expose substantial portions of top surface 6t. It should be understood that a portion of top surface 6t is also uncovered along a back side (not shown) of layer 58 to completely isolate adjacent islands in the photoresist pattern.

Figure 7:
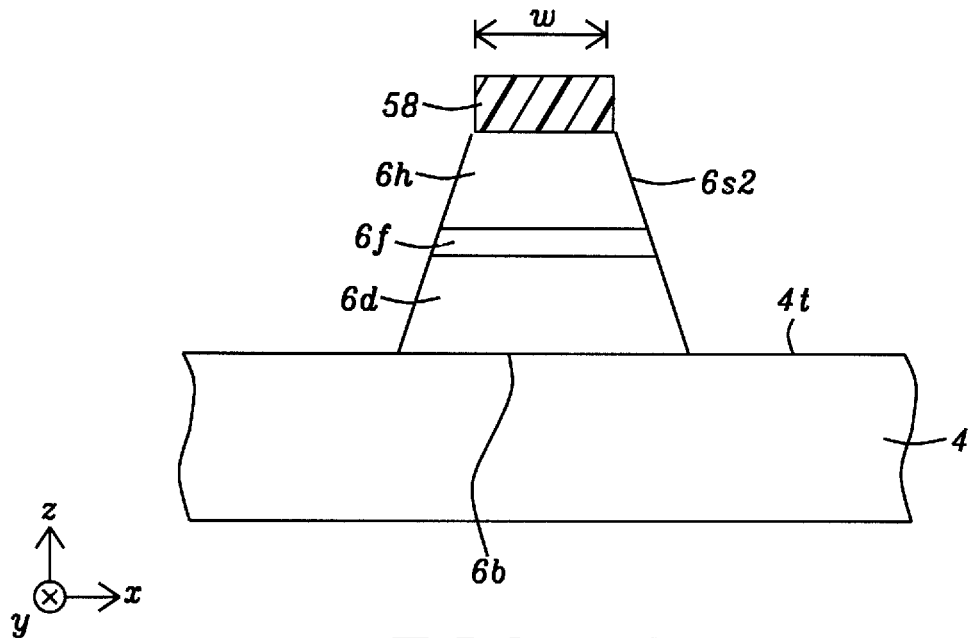

Referring to FIG. 7, a reactive ion etch (RIE) or ion beam etch (IBE) process is performed to transfer the shape of the photoresist island 58 through the sensor stack of layers. The etch process stops on a top surface 4t of the shield. If the dimension w is substantially less than 100 nm, then sloped sidewalls 6s2 are usually desirable to prevent collapse of the sensor during a subsequent milling step. An IBE process is generally preferred as the etch method to generate sloped sidewalls since the ions can be angled with respect to the z-axis direction. As a result, the width of a bottom surface 6b of the sensor is generally greater than the width w at the top surface of upper layer 6h.

Figure 8:
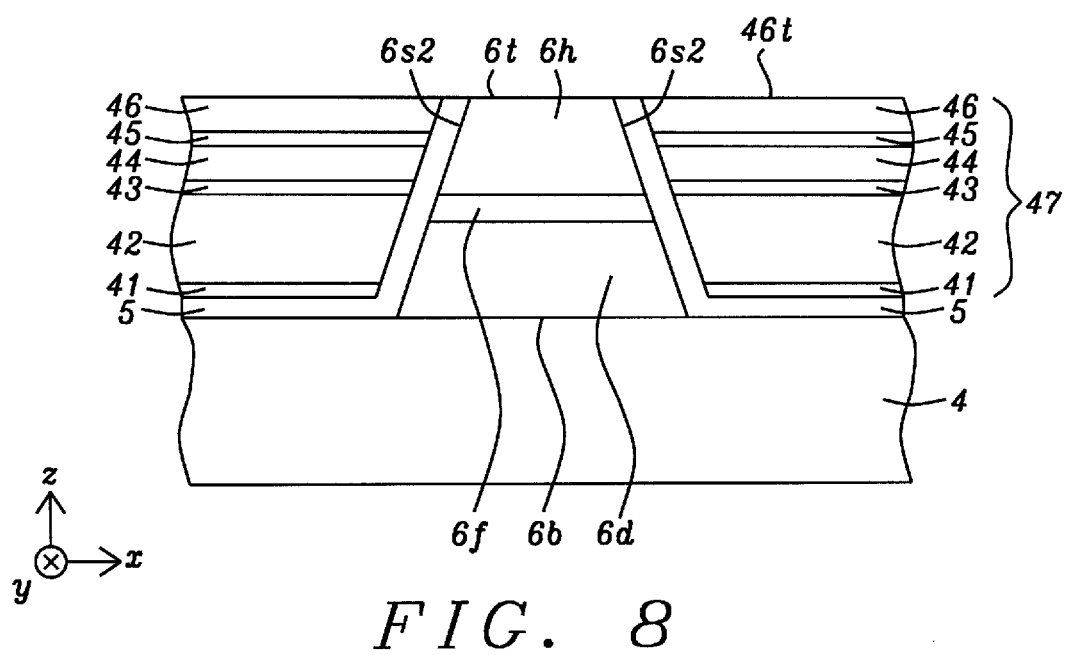

In FIG. 8, read gap layer 5 is deposited along the sidewalls 6s2 and on exposed portions of top surface 4t. Next, the side shields 47 are formed adjacent to sensor sides 6s2 by consecutively depositing the seed layer 41, first magnetic layer 42, first AFM layer 43, second magnetic layer 44, second AFM layer 45, and third magnetic layer 46 with an ion beam deposition (IBD) system. When an IBD method is used for depositing the sideshield layers, the deposition angle may be varied. To minimize the overspray, a shaper may be used in IBD deposition steps. The photoresist island 58 is then removed by a standard liftoff process. A chemical mechanical polish (CMP) process may be employed to form a top surface 46t that is essentially coplanar with a top surface 6t of the sensor.

Thereafter, a top shield is formed by a conventional process to complete the shield structure depicted in FIG. 3. As mentioned previously, a second anneal step may be performed to set the direction of the top shield 4. However, the anneal conditions should not be too strenuous so as not to affect the magnetization in bottom shield 7 or within the magnetic layers in sensor 6.

In summary, we have disclosed a side shield structure and a method of making the same with improved stabilization that provides biasing to a free layer in an adjacent sensor stack. All of the improvements noted herein may be accomplished with materials and processes used in the art. Therefore, enhanced sensor performance in terms of high output sharpness and improved magnetic read width is achieved with no additional cost compared with current fabrication schemes.

While this disclosure has been particularly shown and described with reference to, the preferred embodiment thereof, it will be understood by those skilled in the art that various changes in form and details may be made without departing from the spirit and scope of this disclosure.

We claim:

1. A side shield structure for biasing a free layer in an adjacent magnetoresistive (MR) sensor, the MR sensor has a bottom surface formed on a bottom shield, a top surface contacting a top shield, and sidewalls connecting the top and bottom surfaces and comprises:
   (a) a seed layer; and
   (b) a composite side shield, comprising:
      (1) a first magnetic layer contacting a top surface of the seed layer and having a thickness greater than any other layer in the composite side shield, the first magnetic layer provides a majority of biasing to the free layer;
      (2) a first antiferromagnetic (AFM) coupling layer on the first magnetic layer;
      (3) a second magnetic layer formed on the first AFM coupling layer;
      (4) a second AFM coupling layer on the second magnetic layer; and
      (5) a third magnetic layer formed as the uppermost layer in the composite side shield, the third magnetic layer contacts the top shield and has a top surface that is coplanar with an uppermost capping layer at the MR sensor top surface wherein the uppermost capping layer separates the free layer from the top shield, and the third magnetic layer has a magnetization in a same direction as a magnetization in the first magnetic layer and as a magnetization in the top shield.

2. The side shield structure of claim 1 wherein the seed layer has a thickness from about 5 to 50 Angstroms and is comprised of one or more of Ru and Ta, NiCr, NiFeCr, NiFe, Cu, or Ni, or composites such as Ta/NiCr, Ta/NiFeCr, Ta/NiFe, Ta/Cu, Ta/Ni, or composites wherein Ta in the aforementioned compositions is replaced by Hf, Ti, Zr, Nb, or Mo.

3. The side shield structure of claim 1 wherein the first magnetic layer, second magnetic layer, and third magnetic layer are comprised one or both of a CoFe layer and a NiFe layer with a Ni content in the NiFe layer from about 70 to 90 atomic %.

4. The side shield structure of claim 3 wherein the first magnetic layer has a NiFe/CoFe configuration with the lower NiFe layer having a thickness from about 50 to 300 Angstroms and the upper CoFe layer having a thickness from about 5 to 20 Angstroms, the second magnetic layer is CoFe with a thickness from about 10 to 50 Angstroms, and the third magnetic layer has a CoFe/NiFe configuration wherein the lower CoFe layer has a thickness from about 5 to 20 Angstroms and the upper NiFe layer has a thickness between about 50 and 200 Angstroms.

5. The side shield structure of claim 1 wherein the first AFM coupling layer and second AFM coupling layer are selected from Ru, Rh, RhRu, Re, Ir, and Mo.

6. The side shield structure of claim 1 wherein an insulation layer comprised of AlOx, MgOx, or SiOx and having a thickness from about 10 to 100 Angstroms is formed between the seed layer and bottom shield, and between the MR sensor sidewalls and side shield structure.

7. The side shield structure of claim 1 wherein the MR sensor is part of a read head and is formed along an air bearing surface (ABS), the side shield structure has a side along the ABS and extends for a distance of about 30 nm to 2 microns in a direction perpendicular to the ABS and toward a back end of the read head.

8. The side shield structure of claim 1 wherein each of the bottom shield and top shield have a magnetization in the same direction as the first magnetic layer, and serve to stabilize the magnetization directions in the first magnetic layer and third magnetic layer, respectively.

9. The side shield structure of claim 1 wherein one or more of the first magnetic layer, second magnetic layer, and third magnetic layer are comprised of CoFeNi or CoFeM where M is an element that is V, Mo, Mg, Zr, Hf, Ta, or Nb.

10. A shield structure for biasing a free layer in an adjacent magnetoresistive (MR) sensor, the MR sensor has a bottom surface formed on a bottom shield, a top surface contacting a top shield, and sidewalls connecting the top and bottom surfaces, comprising:
    (a) the bottom shield having a magnetization in a first direction, the first direction is parallel or anti-parallel to a magnetic moment in the free layer;
    (b) a seed layer formed on the bottom shield;
    (c) a composite side shield formed adjacent to the MR sensor sidewalls, comprising:
       (1) a first magnetic layer contacting a top surface of the seed layer and having a magnetization in the first direction;
       (2) a first antiferromagnetic (AFM) coupling layer on the first magnetic layer;
       (3) a second magnetic layer formed on the first AFM coupling layer;
       (4) a second AFM coupling layer on the second magnetic layer; and
       (5) a third magnetic layer formed as the uppermost layer in the composite side shield, the third magnetic layer contacts the top shield and has a magnetization in the first direction; and
    (d) the top shield consisting of a fourth magnetic layer that contacts the third magnetic layer and has a magnetization in the first direction, a third AFM coupling layer contacting a top surface of the fourth magnetic layer, a fifth magnetic layer contacting a top surface of the third AFM coupling layer, and an uppermost antiferromagnetic (AFM) layer, the uppermost AFM layer pins a magnetization in the top shield fifth magnetic layer in a second direction which is opposite to the first direction.

11. The shield structure of claim 10 wherein the seed layer has a thickness from about 5 to 50 Angstroms and is comprised of one or more of Ru and Ta, NiCr, NiFeCr, NiFe, Cu, or Ni, or composites such as Ta/NiCr, Ta/NiFeCr, Ta/NiFe, Ta/Cu, Ta/Ni, or composites wherein Ta in the aforementioned compositions is replaced by Hf, Ti, Zr, Nb, or Mo.

12. The shield structure of claim 10 wherein the first magnetic layer, second magnetic layer, and third magnetic layer are comprised one or both of a CoFe layer and a NiFe layer in which there is a Ni content from about 70 to 90 atomic %.

13. The shield structure of claim 12 wherein the first magnetic layer has a NiFe/CoFe configuration with the lower NiFe layer having a thickness from about 50 to 300 Angstroms and the upper CoFe layer having a thickness from about 5 to 20 Angstroms, the second magnetic layer is CoFe with a thickness from about 10 to 50 Angstroms, and the third magnetic layer has a CoFe/NiFe configuration wherein the lower CoFe layer has a thickness from about 5 to 20 Angstroms and the upper NiFe layer has a thickness between about 50 and 200 Angstroms.

14. The shield structure of claim 10 wherein the first AFM coupling layer and second AFM coupling layer are selected from Ru, Rh, RhRu, Re, Ir, and Mo.

15. The shield structure of claim 10 further comprised of an insulation layer made of AlOx, MgOx, or SiOx and having a thickness from about 10 to 100 Angstroms that is formed between the seed layer and the bottom shield, and between the MR sensor sidewalls and the side shield structure.

16. The shield structure of claim 10 wherein the MR sensor is part of a read head and is formed along an air bearing surface (ABS), the side shield structure has a side along the ABS and extends for a distance of about 30 nm to 2 microns in a direction perpendicular to the ABS and toward a back end of the read head.

17. The shield structure of claim 10 wherein one or more of the first magnetic layer, second magnetic layer, and third magnetic layer are comprised of CoFeNi or CoFeM where M is an element that is V, Mo, Mg, Zr, Hf, Ta, or Nb.

18. A side shield structure for biasing a free layer in an adjacent magnetoresistive (MR) sensor, the MR sensor has a bottom surface formed on a bottom shield, a top surface contacting a top shield, and sidewalls connecting the top and bottom surfaces and comprises:

(a) a seed layer; and
(b) a composite side shield, comprising:
  (1) a first magnetic layer contacting a top surface of the seed layer and having a thickness greater than any other layer in the composite side shield, the first magnetic layer provides a majority of biasing to the free layer;
  (2) a first antiferromagnetic (AFM) coupling layer on the first magnetic layer;
  (3) a second magnetic layer formed on the first AFM coupling layer;
  (4) a second AFM coupling layer on the second magnetic layer; and
  (5) a third magnetic layer formed as the uppermost layer in the composite side shield, the third magnetic layer contacts the top shield and has a magnetization in a same direction as a magnetization in the first magnetic layer and as a magnetization in the top shield, and wherein at least one of the first, second, and third magnetic layers is comprised of CoFeM where M is an element that is V, Mo, Mg, Zr, Hf, Ta, or Nb and is coplanar with an uppermost capping layer in the MR sensor.

* * * * *